(12) United States Patent
Shigeta et al.

(10) Patent No.: US 10,580,674 B2
(45) Date of Patent: Mar. 3, 2020

(54) SUBSTRATE STORING CONTAINER

(71) Applicant: MIRAIAL CO., LTD., Tokyo (JP)

(72) Inventors: Sumie Shigeta, Tokyo (JP); Takayuki Ueno, Tokyo (JP); Shota Fukushima, Tokyo (JP)

(73) Assignee: MIRAIAL CO., LTD., Tokyo (JP)

( * ) Notice: Subject to any disclaimer, the term of this patent is extended or adjusted under 35 U.S.C. 154(b) by 954 days.

(21) Appl. No.: 14/912,845

(22) PCT Filed: Aug. 22, 2013

(86) PCT No.: PCT/JP2013/072471
§ 371 (c)(1),
(2) Date: Feb. 18, 2016

(87) PCT Pub. No.: WO2013/025629
PCT Pub. Date: Feb. 21, 2013

(65) Prior Publication Data
US 2016/0204011 A1 Jul. 14, 2016

(51) Int. Cl.
*H01L 21/673* (2006.01)
(52) U.S. Cl.
CPC .. *H01L 21/67393* (2013.01); *H01L 21/67373* (2013.01); *H01L 21/67379* (2013.01); *H01L 21/67386* (2013.01); *B65D 2585/86* (2013.01)
(58) Field of Classification Search
CPC ......... H01L 21/67393; H01L 21/67373; H01L 21/67379; H01L 21/37386; B65D 2585/86
USPC .......................................... 206/710, 711, 712
See application file for complete search history.

(56) References Cited

U.S. PATENT DOCUMENTS

| 6,098,809 | A  | * | 8/2000 | Okada ....................... G03F 1/66 |
| | | | | 206/232 |
| 6,105,782 | A  | * | 8/2000 | Fujimori ........... H01L 21/67376 |
| | | | | 206/1.5 |
| 6,273,261 | B1 | * | 8/2001 | Hosoi ............... H01L 21/67294 |
| | | | | 206/459.5 |
| 7,922,000 | B2 | | 4/2011 | Hyobu |
| 9,387,960 | B2 | | 7/2016 | Nagashima et al. |
| 2003/0107187 | A1 | * | 6/2003 | Yajima ................... F16J 15/025 |
| | | | | 277/628 |
| 2004/0074808 | A1 | * | 4/2004 | Bhatt ................ H01L 21/67366 |
| | | | | 206/711 |

(Continued)

FOREIGN PATENT DOCUMENTS

| JP | H06-275709 A | 9/1994 |
| JP | H11-059778 A | 3/1999 |

(Continued)

*Primary Examiner* — Ernesto A Grano
(74) *Attorney, Agent, or Firm* — Muncy, Geissler, Olds & Lowe, P.C.

(57) ABSTRACT

The lid body which includes a lid body main body having a lid body inner face and a lid body outer face, is detachable to the opening rim portion, and can close the container main body opening portion, wherein the lid body inner face forms the substrate storing space together with the main body inner face when the container main body opening portion is closed. The external component made from resin that is mounted to at least one of a part of the container main body other than the main body inner face, and a part of the lid body main body other than the lid body inner face. The external component is annealed.

6 Claims, 10 Drawing Sheets

(56) References Cited

U.S. PATENT DOCUMENTS

| | | | | |
|---|---|---|---|---|
| 2005/0109667 A1* | 5/2005 | Burns | B65D 51/26 | 206/710 |
| 2005/0115866 A1* | 6/2005 | Burns | H01L 21/67369 | 206/710 |
| 2007/0108095 A1* | 5/2007 | Burns | E05B 17/0041 | 206/710 |
| 2007/0193907 A1* | 8/2007 | Bhatt | G03F 7/70691 | 206/449 |
| 2010/0276324 A1* | 11/2010 | Hyobu | H01L 21/67346 | 206/449 |
| 2011/0000817 A1* | 1/2011 | Hosoi | H01L 21/67369 | 206/710 |
| 2011/0079539 A1* | 4/2011 | Kamada | H01L 21/67366 | 206/710 |
| 2011/0114534 A1* | 5/2011 | Watson | H01L 21/67393 | 206/710 |
| 2011/0210041 A1* | 9/2011 | Okabe | H01L 21/67393 | 206/710 |
| 2011/0210042 A1* | 9/2011 | Okabe | H01L 21/67376 | 206/710 |
| 2012/0103860 A1 | 5/2012 | Masuko et al. | | |
| 2014/0138279 A1 | 5/2014 | Nagashima et al. | | |

FOREIGN PATENT DOCUMENTS

| | | |
|---|---|---|
| JP | H11-238789 A | 8/1999 |
| JP | 2000-068363 A | 3/2000 |
| JP | 2001-035910 A | 2/2001 |
| JP | 2004-342844 A | 12/2004 |
| JP | 2007-220823 A | 8/2007 |
| JP | 2011-18771 A | 1/2011 |
| TW | 201132563 A | 10/2011 |
| TW | 201328947 A | 7/2013 |
| WO | WO 2013/025629 A2 | 2/2013 |
| WO | WO 2013/025629 A3 | 2/2013 |

* cited by examiner

SUBSTRATE STORING CONTAINER

TECHNICAL FIELD

The present invention relates to a substrate storing container that stores substrates such as semiconductor wafers.

BACKGROUND ART

As a container that stores substrates such as semiconductor wafers, a substrate storing container has been known conventionally that has a container main body, a lid body, an interior component, and an exterior component.

The container main body has a tubular wall portion in which a container main body opening portion is formed at one end, and in which the other end is closed. A substrate storing space is formed in the container main body. The substrate storing space is formed by being surrounded by the wall portion and can store a plurality of substrates. The lid body can be removably attached to the container main body opening portion and can close the container main body opening portion. Substrate support plate-like portions which constitute an interior component are provided at the wall portion so as to form a pair in the substrate storing space. When the container main body opening portion is not closed by the lid body, the substrate support plate-like portions can support edge portions of a plurality of substrates in a state in which adjacent substrates are arranged in parallel to be spaced by a predetermined interval.

A front retainer which constitutes the interior component is provided at a part of the lid which faces a substrate storing space when the container main body opening portion is closed. When the container main body opening portion is closed by the lid body, the front retainer can support edge portions of the plurality of substrates. Since the front retainer as an interior component supports the edge portions of the substrates in this way, high dimensional precision is required. Furthermore, a back side substrate support portion is provided at the wall portion so as to form a pair with the front retainer. The back side substrate support portion can support edge portions of a plurality of substrates. When the container main body opening portion is closed by the lid body, the back side substrate support portion retains a plurality of substrates in a state in which adjacent substrates are arranged in parallel to be spaced apart by a predetermined interval, by supporting the plurality of substrates in cooperation with the front retainer.

The wall portions of the container main body includes a back wall, an upper wall, a lower wall, a first side wall, and a second side wall. A positioning member that constitutes an exterior component is fixed at the lower wall. The positioning member has a V-shaped groove and a support member that supports the substrate storing container is engaged with the groove. With regard to the positioning member as an exterior component, high dimensional precision is not required like that for the front retainer as an interior component that supports the substrates. The substrate storing container is transported in a state of the substrate storing container being supported by the support member due to the engagement of the support member with the groove. Furthermore, the substrate storing container in which the substrates are stored is stored in a container storing bag, the whole of which is sealed and transported by air, etc. The substrate storing container having such an exterior component has been disclosed in PCT International Publication No. WO2013/025629.

Patent Document 1: Pamphlet of PCT International Publication No. WO2013/025629

DISCLOSURE OF THE INVENTION

Problems to be Solved by the Invention

It has been recently required to reduce the influence on substrates such as silicon wafers stored in the substrate storing container caused by outgas from a container main body constituting the substrate storing container.

It is an object of the present invention to provide a substrate storing container that reduces the influence on substrates stored in a substrate storing container caused by outgas from the substrate storing container.

Means for Solving the Problems

The present invention relates to a substrate storing container which stores substrates composed of semiconductor wafers and is transported in a state of being stored in a container storing bag that is entirely sealed, the substrate storing container comprising: a container main body including a main body inner face that forms a substrate storing space that can store a plurality of substrates, and an opening rim portion at which a container main body opening portion in communication with the substrate storing space is formed; a lid body which includes a lid body main body having a lid body inner face and a lid body outer face, is detachable to the opening rim portion, and can close the container main body opening portion, wherein the lid body inner face forms the substrate storing space together with the main body inner face when the container main body opening portion is closed; and an external component made from resin that is mounted to at least one of a part of the container main body other than the main body inner face, and a part of the lid body main body other than the lid body inner face, in which the external component is annealed.

Furthermore, it is preferable that the container main body includes a tubular wall portion in which the container main body opening portion is formed at one end and in which the other end is closed, the wall portion including a back wall, an upper wall, a lower wall, and a pair of side walls, wherein the container main body opening portion is formed by one end of the upper wall, one end of the lower wall, and one end of the side walls, in which an inner face of the upper wall, an inner face of the lower wall, an inner face of the side walls, and an inner face of the back wall constitute a main body inner face, and in which the external component has a size such that, in a direction along the outer face to which the external component is mounted or the lid body outer face among an outer face of the back wall, an outer face of the upper wall, an outer face of the lower wall, outer faces of the side walls, and the lid body outer face, the external component does not go beyond the outer face to which the external component is mounted or the lid body outer face, and falls into an area of the outer face to which the external component is mounted or the lid body outer face.

Furthermore, it is preferable that the external component includes one external component wall portion, and one other external component wall portion which has a positional relationship of intersecting with the one external component wall portion by a predetermined angle and is connected with the one external component wall portion.

Furthermore, it is preferable that the external component is made from any one selected from the group consisting of polybutylene terephthalate, polyacetal, and polypropylene.

Furthermore, it is preferable that a value of a decreased rate of outgas per unit weight of the external component obtained from an amount of outgas obtained by way of DHS method by cutting into predetermined dimensions and heating for one hour at 100° C. in a thermal desorption GC-MS instrument the external component before annealing made from polybutylene terephthalate or polyacetal, and an amount of outgas obtained by way of DHS method by cutting into the predetermined dimensions and heating for one hour at 100° C. with a thermal desorption GC-MS instrument the external component after annealing made from polybutylene terephthalate or polyacetal, is at least 20%.

Furthermore, it is preferable that a value of a decreased rate of outgas per unit weight of the external component obtained from an amount of outgas obtained by way of DHS method by cutting into predetermined dimensions and heating for one hour at 80° C. with a thermal desorption GC-MS instrument the external component before annealing made from polypropylene, and an amount of outgas obtained by way of DHS method by cutting into the predetermined dimensions and heating for one hour at 80° C. with a thermal desorption GC-MS instrument the external component after annealing made of polypropylene, is at least 20%.

Effects of the Invention

According to the present invention, it is possible to provide a substrate storing container that reduces the influence on substrates stored in a substrate storing container caused by outgas from the substrate storing container.

PREFERRED MODE FOR CARRYING OUT THE INVENTION

Figure 1:
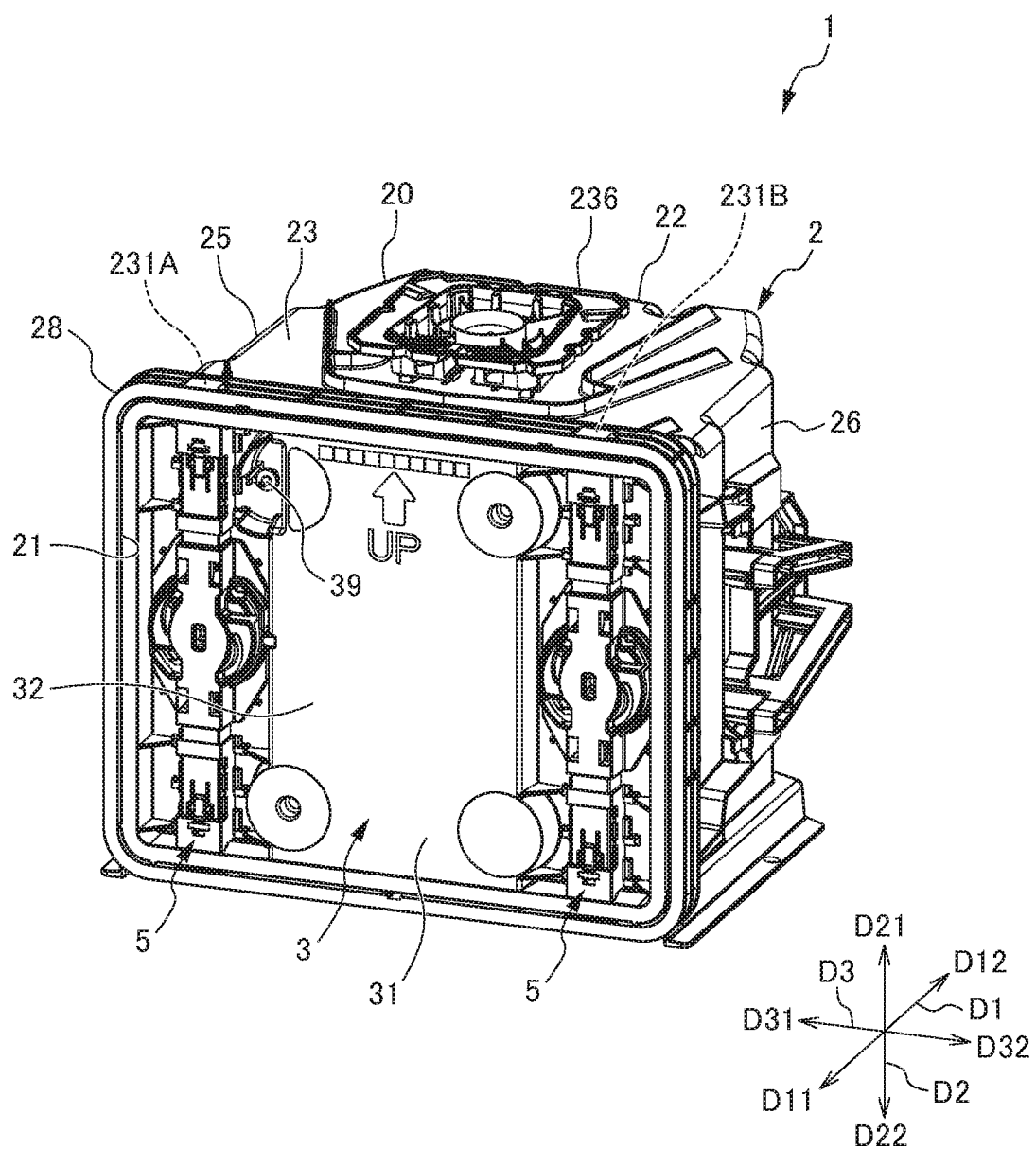
FIG. 1 is a forward perspective view illustrating a substrate storing container 1 according to an embodiment of the present invention.
Figure 2:
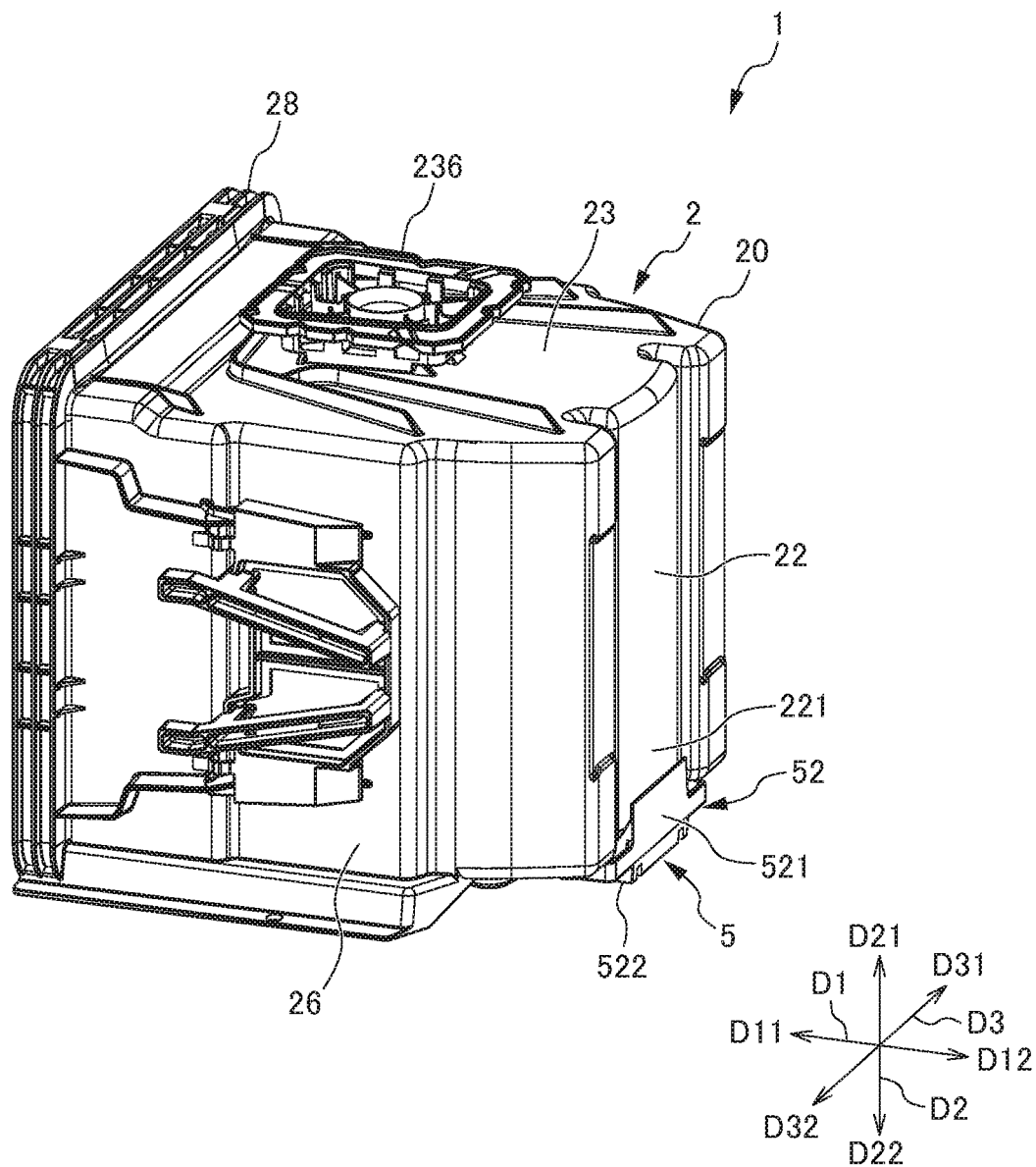
FIG. 2 is a side perspective view illustrating the substrate storing container 1 according to an embodiment of the present invention.
Figure 3:
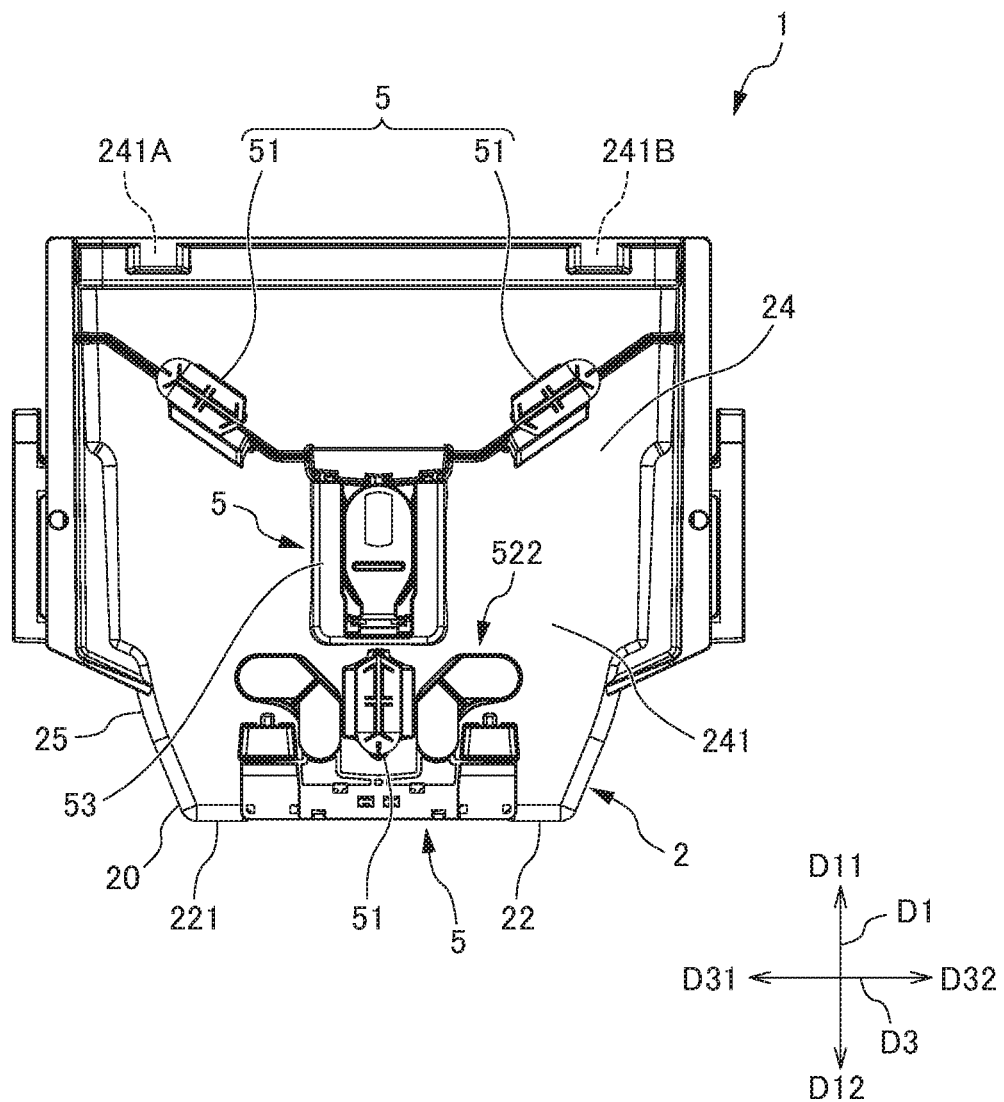
FIG. 3 is a bottom view illustrating the substrate storing container 1 according to an embodiment of the present invention.
Figure 4:
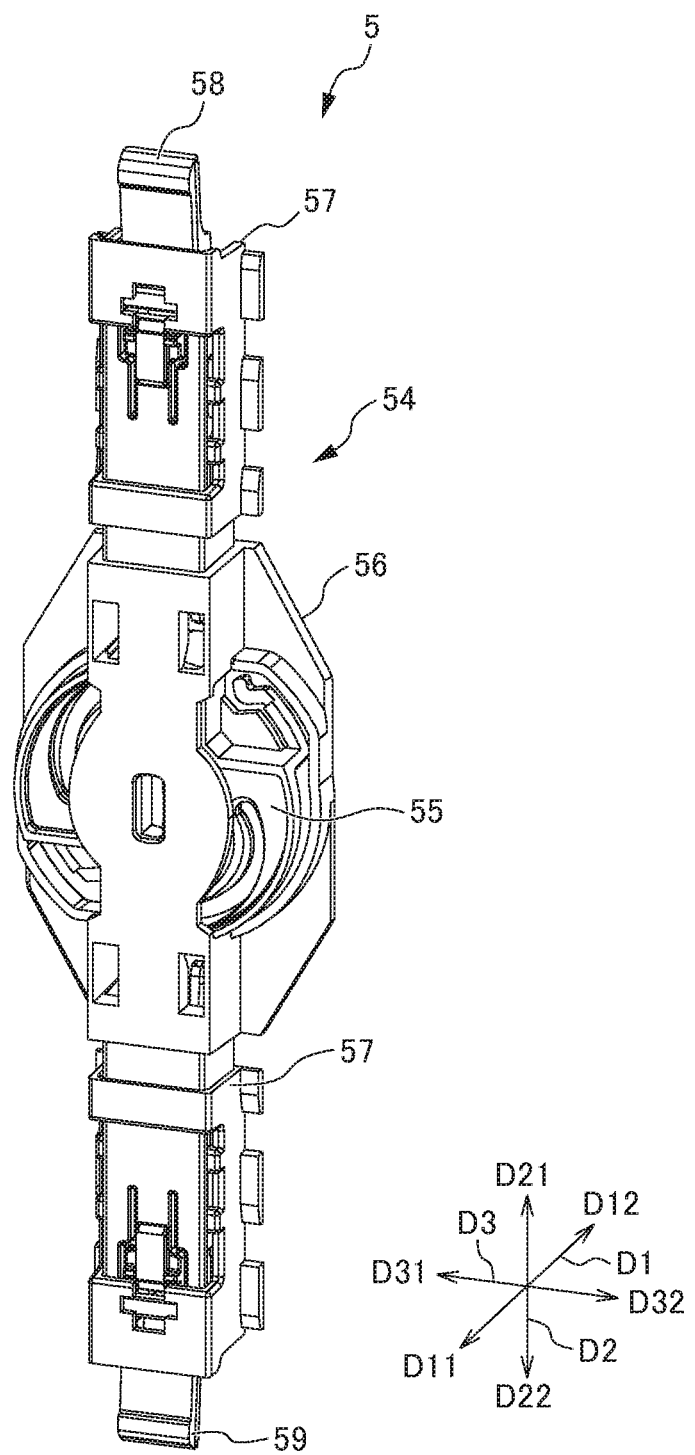
FIG. 4 is a perspective view illustrating a latch cassette 54 of the substrate storing container 1 according to an embodiment of the present invention.
Figure 5:
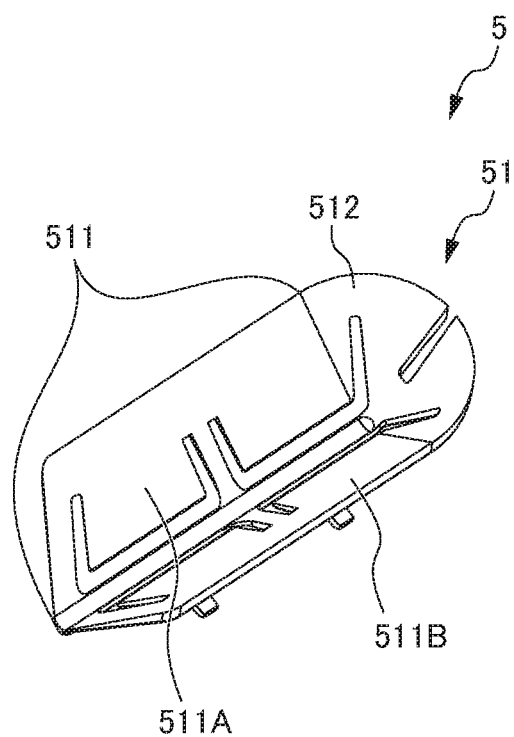
FIG. 5 is a perspective view illustrating a positioning member 51 of the substrate storing container 1 according to an embodiment of the present invention.

In the following, a substrate storing container 1 according to the first embodiment of the present invention is described with reference to the drawings. FIG. 1 is a forward perspective view illustrating a substrate storing container 1 according to an embodiment of the present invention. FIG. 2 is a side perspective view illustrating the substrate storing container 1 according to an embodiment of the present invention. FIG. 3 is a bottom view illustrating the substrate storing container 1 according to an embodiment of the present invention. FIG. 4 is a perspective view illustrating a latch cassette 54 of the substrate storing container 1 according to an embodiment of the present invention. FIG. 5 is a perspective view illustrating a positioning member 51 of the substrate storing container 1 according to an embodiment of the present invention.

Figure 6:
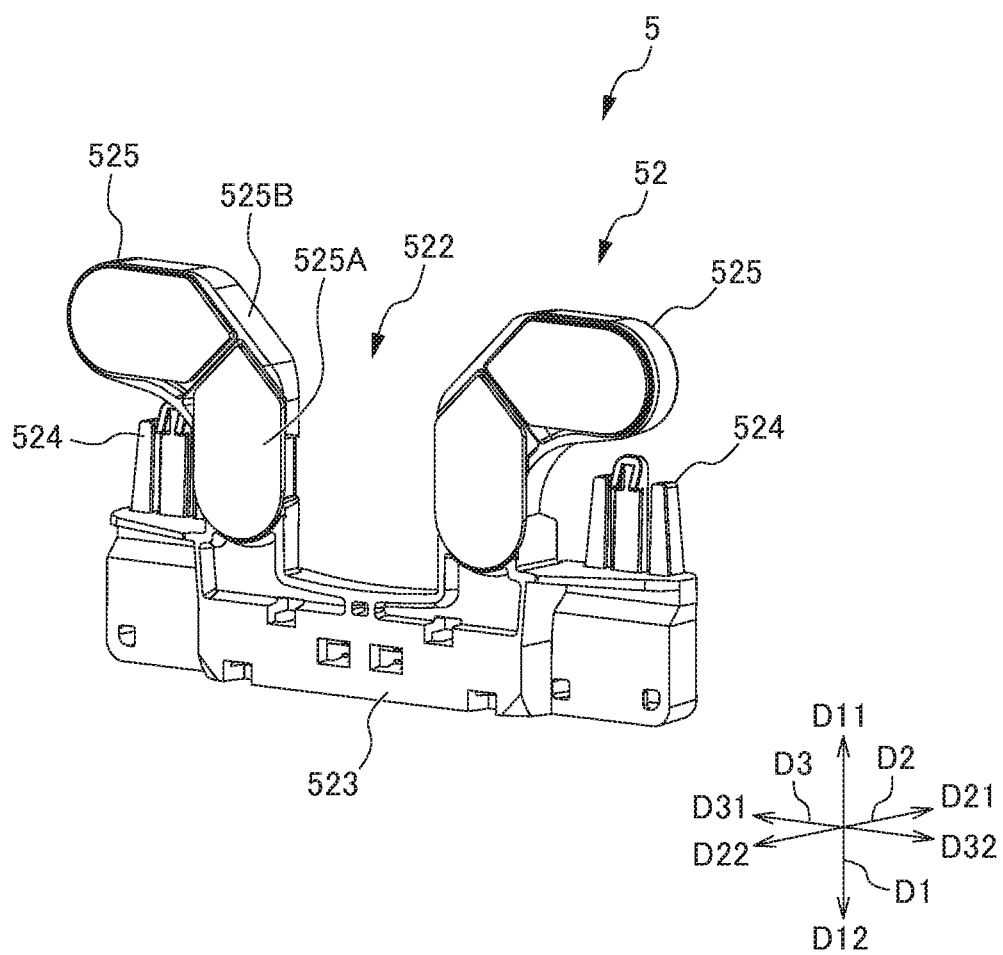
FIG. 6 is a perspective view illustrating an identification member 52 of the substrate storing container 1 according to an embodiment of the present invention.
Figure 7:
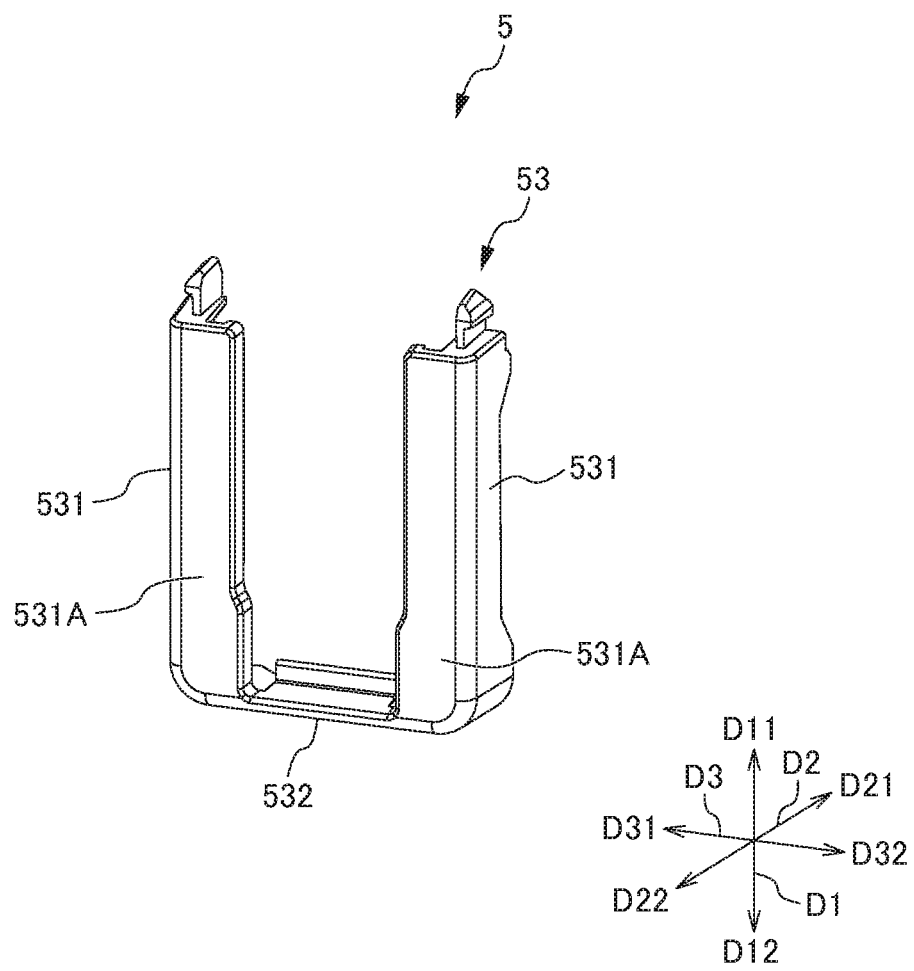
FIG. 7 is a perspective view illustrating a sensing member 53 of the substrate storing container 1 according to an embodiment of the present invention.
Figure 8:
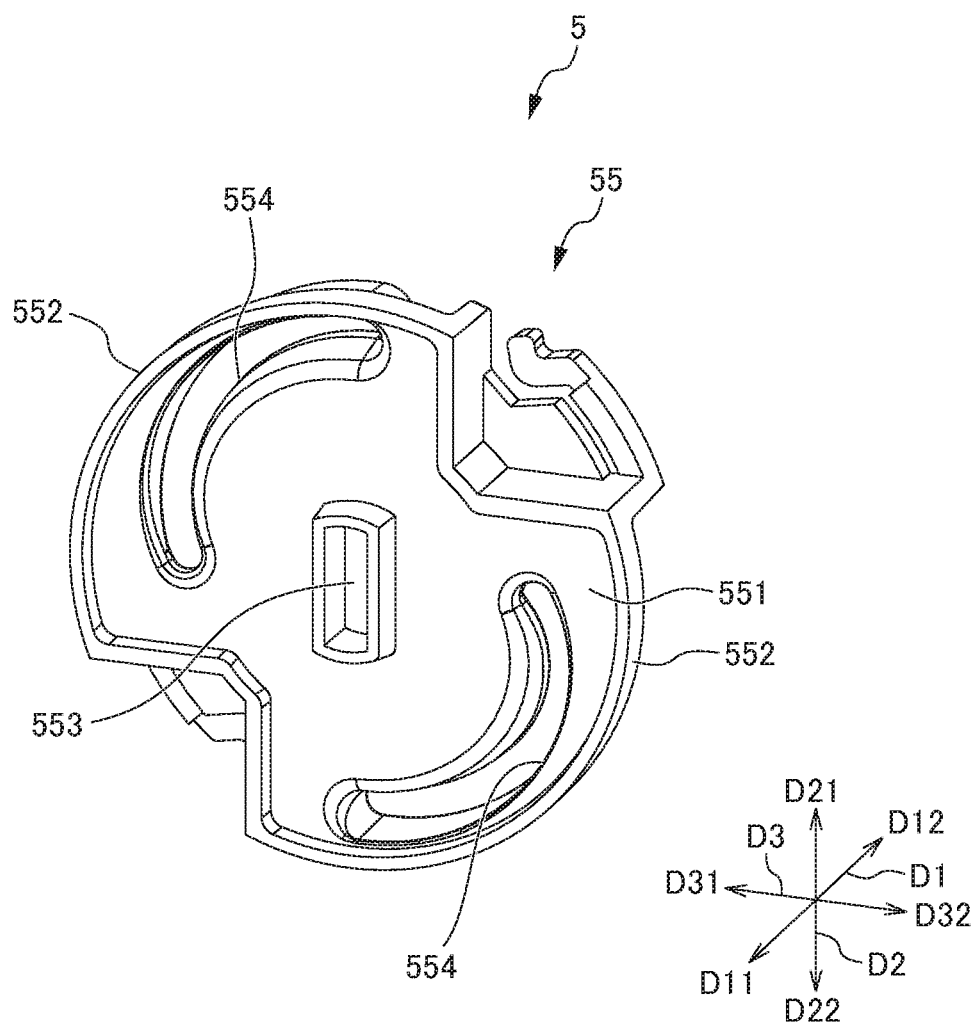
FIG. 8 is a perspective view illustrating a latch rotation member 55 constituting the latch cassette 54 of the substrate storing container 1 according to an embodiment of the present invention.
Figure 9:
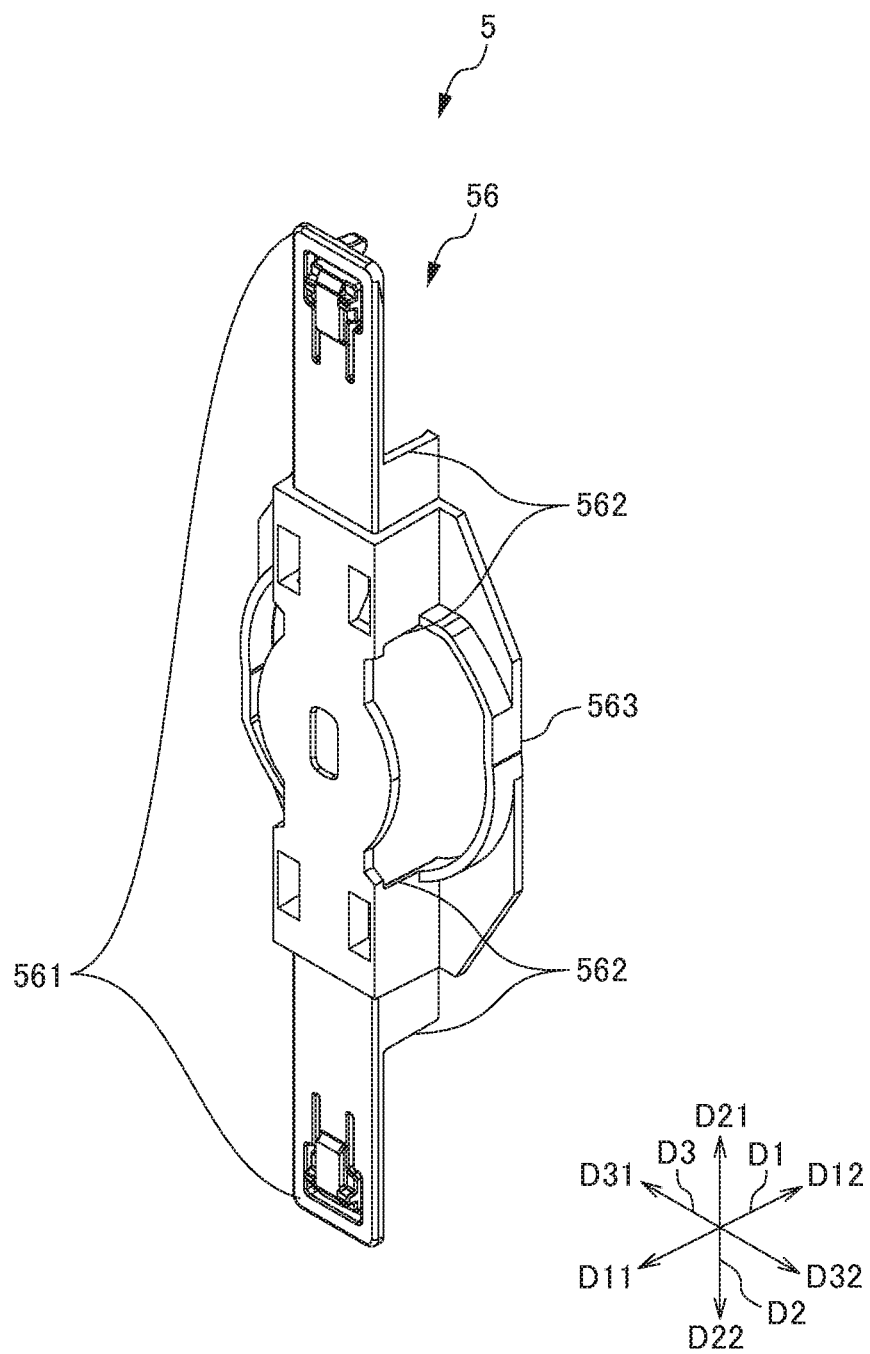
FIG. 9 is a perspective view illustrating a latch cassette portion 56 constituting the latch cassette 54 of the substrate storing container 1 according to an embodiment of the present invention.
Figure 10:
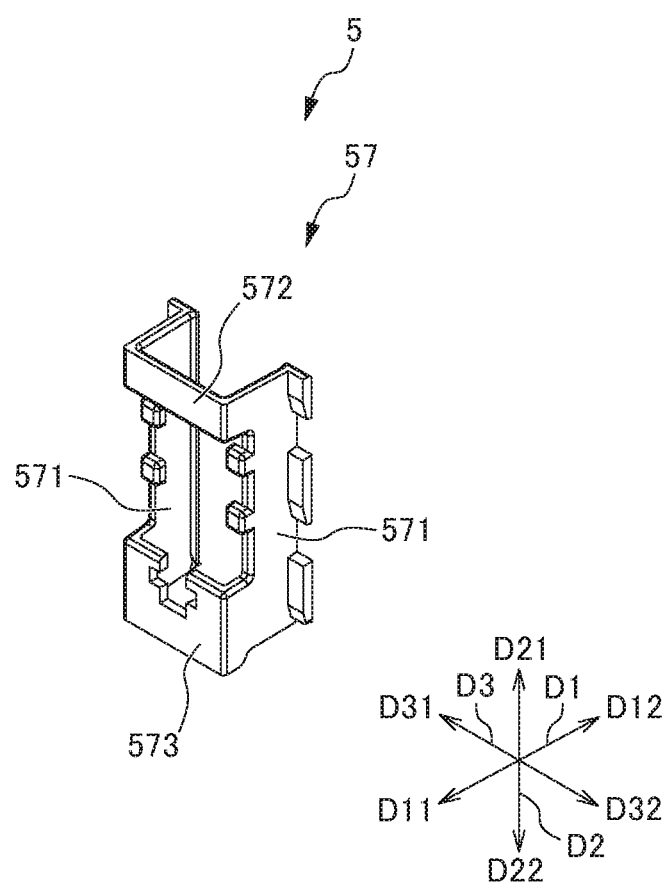
FIG. 10 is a perspective view illustrating a latch cassette portion 57 constituting the latch cassette 54 of the substrate storing container 1 according to an embodiment of the present invention.

FIG. 6 is a perspective view illustrating an identification member 52 of the substrate storing container 1 according to an embodiment of the present invention. FIG. 7 is a perspective view illustrating a sensing member 53 of the substrate storing container 1 according to an embodiment of the present invention. FIG. 8 is a perspective view illustrating a latch rotation member 55 constituting the latch cassette 54 of the substrate storing container 1 according to an embodiment of the present invention. FIG. 9 is a perspective view illustrating a latch cassette portion 56 constituting the latch cassette 54 of the substrate storing container 1 according to an embodiment of the present invention. FIG. 10 is a perspective view illustrating a latch cassette portion 57 constituting the latch cassette 54 of the substrate storing container 1 according to an embodiment of the present invention.

Herein, for the purpose of illustration, the direction from a container main body 2 toward a lid body 3 (described later) (lower left direction in FIG. 1) is defined as a forward direction D11 and the direction opposite to the direction D11 is defined as a backward direction D12. Furthermore, these directions are defined as a forward/backward direction D1. In addition, the direction from a lower wall 24 to an upper wall 23 (described later) (upper direction in FIG. 1) is defined as an upper direction D21 and the direction opposite to the direction D21 is defined as a lower direction D22. Furthermore, these directions are defined as an upper/lower direction D2. Moreover, the direction from a second side wall 26 to a first side wall 25 (described later) (upper left direction in FIG. 1) is defined as a left direction D31 and the direction opposite to the direction D31 is defined as a right direction D32. Furthermore, these directions are defined as a left/right direction D3. Arrows indicating these directions are illustrated in the principal drawings.

Furthermore, a substrate W (not illustrated) stored in a substrate storing container 1 is a disk-like silicon wafer, glass wafer, sapphire wafer, etc., and is a thin member used for industrial use. The substrate W is a silicon wafer having a diameter of 300 mm.

As illustrated in FIG. 1, the substrate storing container 1 includes a container main body 2, a lid body 3, and an exterior component 5. The container main body 2 has a tubular wall portion 20 with a container main body opening portion 21 formed at one end and the other end closed. A substrate storing space (not illustrated) is formed in the container main body 2. The substrate storing space is formed to be surrounded by a main body inner face composed of an inner face of the wall portion 20. A substrate support plate-like portion (not illustrated) constituting an interior component is disposed at a part of the wall portion 20 which forms the substrate storing space. A plurality of substrates can be stored in the substrate storing space (not illustrated).

The substrate support plate-like portion (not illustrated) is provided at the wall portion 20 so as to form a pair in the left/right direction D3 in the substrate storing space. When the container main body opening portion 21 is not closed by the lid body 3, the substrate support plate-like portion (not illustrated) can support the edge portions of the plurality of substrates in a state in which adjacent substrates are arranged in parallel to be spaced apart by a predetermined interval. The back side support plate-like portion (not illustrated) is provided at the back side of the substrate support plate-like portion. When the container main body opening portion 21 is closed by the lid body 3, the back side substrate support portion can support rear portions of the edge portions of the plurality of substrates.

The lid body 3 can be removably attached to the container main body opening portion 21 and can close the container main body opening portion 21. When the lid body 3 closes the container main body opening portion 21, a lid body inner face (a back side face of the lid body 3 illustrated in FIG. 1) forms a substrate storing space with the inner face of the container main body 2 (inner face of the main body constituted by the inner side faces of the container main body 2). A front retainer (not illustrated) which constitutes an interior component is provided at a part of the lid body 3 (lid body inner face) which faces the substrate storing space when the container main body opening portion 21 is closed by the lid body 3. The front retainer (not illustrated) is provided so as to form a pair with the back side substrate support portion. A portion which is a surface of the lid body 3 other than the lid body inner face constitutes a lid body outer face 31.

When the container main body opening portion 21 is closed by the lid body 3, the front retainer (not illustrated) can support front parts of the edge portions of the plurality of substrates. When the container main body opening portion 21 is closed by the lid body 3, the front retainer (not illustrated) retains the plurality of substrates in a state in which adjacent substrates are arranged in parallel to be spaced apart by a predetermined interval by supporting the plurality of substrates in cooperation with the back side substrate support portion (not illustrated).

The exterior component 5 is mounted to a part of the container main body 2 other than the main body inner face and a part of the lid body main body 32 other than the lid body inner face. More specifically, the exterior component 5 is configured with the positioning member 51, the identification member 52, the sensing member 53, the latch rotation member 55, the latch cassette portion 56, the latch cassette portion 57, etc. As illustrated in FIG. 3, the positioning member 51 is mounted to be fixed at an outer face 241 of the lower wall 24. As illustrated in FIGS. 2 and 3, the identification member 52 is mounted to be fixed at the container main body 2 so as to extend over the outer face 241 of the lower wall 24 and the outer face 221 of the back wall 22 at the lower portion of the rear portion of the container main body 2. As illustrated in FIG. 3, the sensing member 53 is mounted to be fixed at the outer face 241 of the lower wall 24. The latch rotation member 55, the latch cassette portion 56, and the latch cassette portion 57 are combined to constitute the latch cassette 54. As illustrated in FIG. 1, the latch cassette 54 is mounted at the lid body outer face 31 of the lid body 3.

The substrate storing container 1 as described above is stored in a substrate storing container storing bag (not illustrated), the whole of which is sealed. The substrate storing container storing bag is configured by a variety of synthetic resin sheets (polyamide resin, polyprophylene, polyethylene, and the like), a variety of metal sheets (aluminum), a laminated sheet thereof, or a metal deposition sheet. The substrate storing container 1 is transported by air, for example, in such a state. In the following, each portion will be described in detail.

As illustrated in FIGS. 1 to 3, the wall portion 20 of the container main body 2 includes a back wall 22, an upper wall 23, a lower wall 24, a first side wall 25, and a second side wall 26. The back wall 22, the upper wall 23, the lower wall 24, the first side wall 25, and the second side wall 26 are made of a plastic material, etc., and are configured so as to be integrally molded with polycarbonate in the first embodiment.

The first side wall 25 faces the second side wall 26 and the upper wall 23 faces the lower wall 24. A rear end of the upper wall 23, a rear end of the lower wall 24, a rear end of the first side wall 25, and a rear end of the second side wall 26 are all connected to the back wall 22. A front end of the upper wall 23, a front end of the lower wall 24, a front end of the first side wall 25, and a front end of the second side wall 26 have a positional relationship opposite the back wall 22, and configure an opening rim portion 28 which forms the container main body opening 21 in a substantially rectangular shape.

The opening rim portion 28 is provided at one end of the container main body 2, and the back wall 22 is located at the other end of the container main body 2. The profile of the container main body 2 formed by the outer faces of the wall portion 20 is a box shape. Inner faces of the wall portion 20 constituting the main body inner face, i.e. an inner face of the back wall 22, an inner face of the upper wall 23, an inner face of the lower wall 24, an inner face of the first side wall 25, and an inner face of the second side wall 26, form the substrate storing space, which is surrounded thereby. The container main body opening portion 21 formed by the opening rim portion 28 is surrounded by the wall portion 20 and is in communication with the substrate storing space (not illustrated) formed inside the container main body 2. The substrate storing space can store a maximum of twenty-five substrates W in a positional relationship of an upper face and a lower face of a substrate being substantially horizontal.

As illustrated in FIGS. 1 and 3, latch engagement concave portions 231A, 231B, 241A, and 241B, which are concave outwardly from the substrate storing space, are formed at portions of the upper wall 23 and the lower wall 24 which are proximal to the opening rim portion 28. Each of the latch engagement concave portions 231A, 231B, 241A, and 241B is respectively formed in the vicinities of both right and left ends of the upper wall 23 and the lower wall 24. The total amount thereof is four.

As illustrated in FIG. 1, a flange fixing portion (not illustrated) is provided so as to be integrally formed with the upper wall 23 at an outer face of the upper wall 23. The flange fixing portion (not illustrated) is disposed at the center portion of the upper wall 23. As illustrated in FIG. 1, the top flange 236 is fixed at the flange fixing portion (not illustrated). The top flange 236 is disposed at the center portion of the upper wall 23. The top flange 236 is hung to these mechanical arms (not illustrated) as a lifting member when suspending the substrate storing container 1 by AMHS (Automated Material Handling System), PGV (Person Guided Vehicle), etc., whereby the substrate storing container 1 is suspended by the arms.

As illustrated in FIG. 3, three of the positioning members 51 are arranged in positional relationships of 120 degrees around the center of the lower wall 24. As illustrated in FIG. 5, the positioning member 51 includes a gable portion 511 and a semi-conical portion 512. The semi-conical portion 512 has a shape made by cutting one cone in half from a face including the shaft center, for example. However, in practice, the pair of the semi-conical portions 512 is not formed by cutting one cone, but is formed by being integrally molded with the gable portion 511.

The gable portion 511 has a gable-roof shape. More specifically, regarding the gable portion 511, the gable-roof shape is formed by one wall-like portion 511A constituting one exterior component wall portion and the other wall-like portion 511B constituting the other exterior component wall portion which has a positional relationship of intersecting with the one wall-like portion 511A by a predetermined angle (by an obtuse angle) and is connected with the one wall-like portion 511A by being integrally molded. With such a configuration, occurring deformation at the positioning member 51 in dimension caused by an internal stress after molding the positioning member 51 is suppressed.

Furthermore, the dimensions of the positioning member 51 are small compared to the dimensions of the lower wall 24. More specifically, as illustrated in FIG. 3, the positioning member 51 has a size such that the positioning member 51 does not go beyond the outer face 241 of the lower wall 24 to which the positioning member 51 is attached, and thus falls into the area of the outer face 241 of the lower wall 24 to which the positioning member 51 is attached in a direction along the outer face 241 of the lower wall 24 (a direction parallel to the forward/backward direction D1 and the left/right direction D3).

The positioning member 51 is integrally molded from PBT (polybutylene terephthalate) and is annealed. The conditions of the annealing process are acceptable so long as being from approximately 30 minutes to 12 hours at 80° C. to 200° C. In an example of the present application, it is 2 hours at 100° C.

As illustrated in FIGS. 2 and 3, the identification member 52 includes a rear wall 521 along the back wall 22 and a bottom portion identification portion 522 along the lower wall 24. In other words, the identification member 52 includes the rear wall 521 constituting one exterior component wall portion and the bottom portion identification portion 522 constituting the other external component wall portion which has a positional relationship of intersecting with the rear wall 521 by a predetermined angle (by a right angle), and is connected with the rear wall 521 by being integrally molded. With such a configuration, occurring deformation at the identification member 52 in dimension caused by an internal stress after molding the identification member 52 is suppressed.

Furthermore, as illustrated in FIG. 6, the bottom portion identification member 522 includes a base portion 523, a first forward protrusion portion 524, and a second forward protrusion portion 525. The base portion 523 extends in the left/right direction D3 and is connected to the rear wall 521 (refer to FIG. 2). The first forward protrusion portion 524 protrudes toward the forward direction D11 from both left and right ends of the base portion 523. The second forward protrusion portions 525 protrude toward the forward direction D11 from a position close to the center of the base portion more than the first forward protrusion portion 524 in the left/right direction D3, and are bent in the middle to distance away from each other in the left/right direction D3.

Furthermore, the bottom portion identification member 522 includes a planar portion 525A and an edge portion wall portion 525B which is provided at the rim of the planar portion 525A, and has a positional relationship of intersecting with the planar portion 525A by 90° as a predetermined angle. In other words, the bottom portion identification portion 522 includes the planar portion 525A constituting one external component wall portion and the edge portion wall portion 525B which has a positional relationship of intersecting with the planar portion 525A by a predetermined angle (by a right angle), and is connected with the planar portion 525A by being integrally molded. Due to this, deformation occurring at the identification member 52 in dimension caused by an internal stress after molding the identification member 52 is suppressed.

Furthermore, as illustrated in FIGS. 2 and 3, the dimensions of the rear wall 521 and the bottom portion identification portion 522 are small compared to the back wall 22 and the lower wall 24, respectively. More specifically, the rear wall 521 has a size such that the rear wall 521 does not go beyond the outer face 221 of the back wall 22 to which the back wall 22 is attached, and thus falls into the area of the outer face 221 of the rear wall 22 to which the rear wall 521 is attached in a direction along the outer face of the back wall (a direction parallel to the upper/lower direction D2 and left/right direction). Furthermore, the bottom portion identification portion 522 has a size such that the bottom portion identification portion 522 does not go beyond the outer face 221 of the lower wall 24 to which the bottom portion identification portion 522 is attached, and thus falls into the area of the outer face 241 of the lower wall 24 to which the bottom portion identification portion 522 is attached in a direction along the outer face 241 of the lower wall 24 (a direction parallel to the forward/backward direction D1 and the left/right direction D3).

The identification member 52 is integrally molded from PP (polypropylene) and is annealed. The conditions of the annealing process are acceptable so long as being from approximately 30 minutes to 12 hours at 80° C. to 200° C. In an example of the present application, it is 2 hours at 100° C.

As illustrated in FIG. 7, the sensing member 53 constituting the external component 5 has a substantially U-shape and includes a pair of side walls 531 and a rear wall 532 which integrally connects rear edges of the pair of side walls 531 with each other. Furthermore, the sensing member 53 includes wall portions 531A which extend in parallel in the forward/backward direction D1 and the left/right direction D3 along the pair of side walls 531, respectively. The wall portions 531A have a positional relationship orthogonal to the pair of side walls 531 and are connected with the pair of side walls 531 by being integrally molded. In other words, the sensing member 53 includes the wall portions 531A constituting one external component wall portion and the side walls 531 which have a positional relationship of intersecting with the wall portions 531A by a predetermined angle (by a right angle) and are connected with the wall portions 531A. Due to this, deformation occurring at the sensing member 53 in dimension caused by an internal stress after molding the sensing member 53 is suppressed.

Furthermore, as illustrated in FIG. 3, the dimensions of the sensing member 53 are small compare to the dimensions of the lower wall 24, respectively. More specifically, the sensing member 53 has a size such that the sensing member 53 does not go beyond the outer face 241 of the lower wall 24 to which the sensing member 53 is attached, and thus falls into the area of the outer face 241 of the lower wall 24 to which the sensing member 53 is attached in a direction along the outer face 241 of the lower wall 24 (a direction parallel to the forward/backward direction D1 and the left/right direction D3).

The sensing member 53 is integrally molded from PBT (polybutylene terephthalate) and is annealed. The conditions of the annealing process are acceptable so long as being from approximately 30 minutes to 12 hours at 80° C. to 200° C. In an example of the present application, it is 2 hours at 100° C.

As illustrated in FIG. 1, the lid body 3 has a substantially rectangular shape which substantially corresponds to the shape of the opening rim portion 28 of the container main body 2. The lid body 3 is detachable to the opening rim portion 28 of the container main body 2, and the container main body opening portion 21 can be closed by the lid body 3 by the lid body 3 being attached to the opening rim portion 28. The lid body 3 includes a lid body main body 32.

The lid body main body 32 has a plate-like shape in a substantially rectangular shape and is configured by being integrally molded with polycarbonate. The lid body main body 32 includes a lid body inner face 31 (not illustrated), and the lid body inner face is a part of the lid body 3 and constitutes a part which forms the substrate storing space.

A ring-like sealing member (not illustrated) is attached to a rim portion of the lid body main body 32 which is an inner face of the lid body main body 32 constituting a lid body inner face of the lid body 3 (a back side face of the lid body 3 illustrated in FIG. 1). The sealing member is arranged so as to go around the rim portion of the lid body main body 32. The sealing member is made of various thermoplastic elastomers such as elastically deformable polyesters and polyolefins; fluorine containing rubber; silicone rubber; etc.

When the lid body 3 is attached to the opening rim portion 28, the sealing member (not illustrated) is elastically deformed by being sandwiched between a portion of the container main body 2 and the inner face of the lid body main body 32, and the lid body 3 closes the container main body opening portion 21. By the lid body 3 being removed from the opening rim portion 28, it becomes possible to load or unload the substrates relative to the substrate storing space in the container main body 2.

As illustrated in FIG. 1, the latch cassette 54 is fixed to the outer face of the lid body main body 32 (a face on a near side of the lid body 3 illustrated in FIG. 1) for mounting, and constitutes a latch mechanism. The latch cassette 54 is provided so as to be provided in the vicinity of both left and right ends of the lid body 3. As illustrated in FIG. 4, the latch cassette 54 includes a upper side latch portion 58 which can project from the upper side of the lid body 3 in the upper direction D21, a lower side latch portion 59 which can project from a lower side of the lid body 3 in the lower direction D22, the latch rotation member 55, the latch cassette portion 56, and the latch cassette portion 57. The upper side latch portion 58 is arranged in the vicinity of the left and right ends of the upper side of the lid body 3, and the lower side latch portion 59 is arranged in the vicinity of the left and right ends of the lower side of the lid body 3.

As illustrated in FIG. 8, the latch rotation member 55 includes a rotation member flat portion 551 and a rotation member rim wall 552. The rotation member flat portion 551 has a substantially circular shape. The rotation member rim wall 552 is connected with the rotation member flat portion 551 by being integrally molded, is provided along the rim of the rotation member flat portion 551, and has a positional relationship orthogonal to the rotation member flat portion 551. In other words, the latch rotation member 55 includes the rotation member flat portion 551 constituting one external component wall portion and the rotation member rim wall 552 which has a positional relationship of intersecting with the rotation member flat portion 551 by a predetermined angle (by a right angle), and is connected with the rotation member flat portion 551. Due to this, deformation occurring at the latch rotation member 55 in dimension caused by an internal stress after molding the latch rotation member 55 is suppressed.

Furthermore, at the center of the rotation member flat portion 551, a through-hole 553 in a substantially rectangular shape is formed so that a key (not illustrated) for rotating the latch rotation member 55 can be inserted therethrough. Furthermore, at the rotation member flat portion 551, a pair of elongated holes 554 is formed. The elongated holes 554 are formed so as to draw an arch in a positional relationship of point symmetry with the center position of the rotation member flat portion 551 as a center. The elongated holes 554 can guide the upper side latch portion 58 and the lower side latch portion 59 in the upper/lower direction D2.

Furthermore, the dimensions of the latch rotation member 55 are small compared to the dimensions of the lid body outer face 31 of the lid body main body 32. More specifically, the latch rotation member 55 has a size such that the latch rotation member 55 does not go beyond the lid body outer face 31 to which the latch rotation member 55 is attached, and thus falls into the area of the lid body outer face 31 to which the latch rotation member 55 is attached in a direction along the lid body outer face 31 of the lid body main body 32 (a direction parallel to the upper/lower direction D2 and the left/right direction D3).

The latch rotation member 55 is integrally molded from POM (polyacetal) resin as a main component and is annealed. The conditions of the annealing process are acceptable so long as being from approximately 30 minutes to 12 hours at 80° C. to 200° C. In an example of the present application, it is 2 hours at 100° C.

As illustrated in FIG. 9, the latch cassette portion 56 includes an elongated portion 561 side plate portions 562, and a side plate connection portion 563. The elongated portion 561 includes a plate shape in a rectangular shape which is long in the upper/lower direction D2. The side plate portion 562 includes a plate shape which is orthogonal to the elongated portion 561 along a part of a side edge portion of the long side portion 561. The side plate portions 562 are connected with the elongated portion 561 by being integrally molded and exist at a portion close to one end and at a portion close to the other end in the longitudinal direction of the elongated portion 561. In other words, the latch cassette portion 56 includes the elongated portion 561 constituting one external component wall portion and the side plate portions 562 which have a positional relationship of intersecting with the elongated portion 561 by a predetermined angle (by a right angle) and are connected with the elongated portion 561. Due to this, deformation occurring at the latch cassette portion 56 in dimension caused by an internal stress after molding the latch cassette portion 56 is suppressed.

The side plate connection portion 563 is connected with the elongated portion 561 and the side plate portions 562 by being integrally molded and connects the side plate portions 562 which exist at a portion close to one end and at a portion close to the other end in a longitudinal direction of the elongated portion 561. As illustrated in FIG. 4, the latch rotation member 55 is supported in a rotatable manner by means of the center portion of the elongated portion 561, the ends of the side plate portions 562, and the side plate connection portion 563.

Furthermore, the dimensions of the latch cassette portion 56 are small compared to the dimensions of the outer face of the lid body main body 32. More specifically, as illustrated in FIG. 1, the latch cassette member 56 has a size such that the latch cassette member 56 does not go beyond the lid body outer face 31 to which the latch cassette member 56 is attached, and thus falls into the area of the lid body outer face 31 to which the latch cassette member 56 is attached in a direction along the lid body outer face 31 (a direction parallel to the upper/lower direction D2 and the left/right direction D3).

The latch cassette portion 56 is integrally molded from PBT (polybutylene terephthalate) and is annealed. The conditions of the annealing process are acceptable so long as being from approximately 30 minutes to 12 hours at 80° C. to 200° C. In an example of the present application, it is 2 hours at 100° C.

As illustrated in FIG. 10, the latch cassette portion 57 includes a pair of side plate portions 571, a one end side connection plate 572, and the other side connection plate 573. The pair of side plate portions 571 has a plate shape in a substantially rectangular shape, respectively, and has a positional relationship in parallel to each other. The one end side connection plate 572 is connected with the pair of side plate portions 571 by being integrally molded in a positional relationship orthogonal to the pair of side plate portions 571 and connects the one ends of the pair of side plate portions 571. Furthermore, the other end side connection plate 573 is connected with the pair of side plate portions 571 by being integrally molded in a positional relationship orthogonal to the pair of side plate portions 571 and connects the other ends of the pair of side plate portions 571.

In other words, the latch cassette portion 57 includes the side plate portion 571 constituting one external component wall portion and the one end side connection plate 572 and the other end side connection plate side 573 which has a positional relationship of intersecting with the side plate portion 571 by a predetermined angle (by a right angle), and are connected with the side plate portion 571. Due to this, deformation occurring at the latch cassette portion 57 in dimension caused by an internal stress after molding the latch cassette portion 57 is suppressed. The latch cassette portions 57 are connected with both ends in the longitudinal direction of the elongated portion 561 of the latch cassette portion 56, and thus constitute a latch cassette 54.

Furthermore, the dimensions of the latch cassette portion 57 are small compared to the dimensions of the lid body outer face 31. More specifically, the latch cassette member 57 has a size such that the latch cassette member 57 does not go beyond the lid body outer face 31 to which the latch cassette member 57 is attached, and thus falls into the area of the lid body outer face 31 to which the latch cassette member 57 is attached in a direction along the lid body outer face 31 (a direction parallel to the upper/lower direction D2 and the left/right direction D3).

The latch cassette portion 57 is integrally molded from PBT (polybutylene terephthalate) and is annealed. The condition of the annealing process is acceptable so long as being from approximately 30 minutes to 12 hours at 80° C. to 200° C. In an example of the present application, it is 2 hours at 100° C.

For the latch cassette 54 as described above, by operating the latch rotation member 55 from the forward direction D11 of the lid body 3, it is possible to make the upper side latch portion 58 and the lower side latch portion 59 protrude from the upper side and the lower side of the lid body 3, respectively, and also possible not to make a state of the upper side latch portion 58 and the lower side latch portion 59 protruding from the upper side and the lower side of the lid body 3, respectively. The upper side latch portion 58 protrudes toward the upper direction D21 from the upper side of the lid body 3 and is engaged with the latch engagement concave portions 231A and 231B of the container main body 2, and the lower side latch portion 59 protrudes toward the lower direction D22 from the lower side of the lid body 3 and is engaged with the latch engagement concave portions 241A and 241B of the container main body 2. With such a configuration, the lid body 3 is fixed to the opening rim portion 28 of the container main body 2.

A concave portion (not illustrated), which is concave outwardly from the substrate storing space, is formed inside of the lid body 3 (the lid body inner face) at the lid body main body 32. In the concave portion (not illustrated), a front retainer (not illustrated) is provided and fixed.

The front retainer includes a front retainer substrate receiving portion (not illustrated). The front retainer substrate receiving portion is arranged in two pieces to be spaced apart by a predetermined interval in the left/right direction D3 so as to form a pair. The front retainer substrate receiving portions arranged in two pieces so as to form a pair as above are provided such that twenty-five pieces thereof are arranged in parallel in the upper/lower direction D2. By the substrates being stored in the substrate storing space and the lid body 3 being closed, the front retainer substrate receiving portion sandwiches and supports end edges of the edges of the substrates.

Next, the experiments for comparing the amount of outgas from the above-described external component 5 were carried out. In the experiments, with the latch cassette portion 56, the latch cassette portion 57, the positioning member 51, the sensing member 53, the latch rotation member 55, and the identification member 52 which constitute the external component 5 being Component 1 to Component 6, respectively, Component 1 to Component 6 that were cut into squares of 3 mm to 4 mm and Component 1 to Component 6 that were cut into squares of 3 mm to 4 mm before annealing were prepared separately. Then, these were put into glass tubes separately and heated under inert gas circulating in a thermal desorption GC-MS instrument separately, and measured by way of the dynamic headspace (DHS) method, which is a kind of the headspace method. The headspace method is a method of distributing gas in a sample to a vapor phase above the sample and, after reaching the equilibrium between the sample and the vapor phase, collecting and analyzing the vapor phase. The DHS method is a method of collecting, condensing, and analyzing by flowing inert gas continuously to the vapor phase so that the gas is distributed continuously from the sample and the discharge of the gas inside the sample is promoted. Herein, the sample refers to, in the present experiments, Component 1 to Component 6 that are cut into squares of 3 mm to 4 mm. By comparing the measurement results for the respective Component 1 to Component 6 with the measurement results for the respective Component 1 to Component 6 which have not been annealed, the decreased rate of outgas per unit weight of each component by the annealing was calculated. Herein, "outgas" refers to not only specific kinds of gases such as chlorine, but also all kinds of gases discharged from one component among Component 1 to Component 6.

The heating condition of the thermal desorption GC-MS device was one hour at 100° C. for Component 1 to Component 5 made from PBT or POM and one hour at 80° C. for Component 6 made from PP. Under this heating condition, with the abovementioned DHS method, it is possible to promote discharging a gas which is included in a resin (PBT, POM, PP) constituting Component 1 to Component 6 more than a situation in which the external component 5 is mounted in practice to the container main body 2. The experimental results are shown in Table 1 below.

TABLE 1

|  |  | COMPONENT 1 | COMPONENT 2 | COMPONENT 3 | COMPONENT 4 | COMPONENT 5 | COMPONENT 6 |
|---|---|---|---|---|---|---|---|
| RAW MATERIAL |  |  | PBT |  |  | MAIN COMPONENT POM | PP |
| ppm PER UNIT WEIGHT (μg/g) | BEFORE ANNEALING | 2.9 | 2.7 | 10.4 | 3.9 | 3.6 | 34.5 |
|  | AFTER ANNEALING | 1.6 | 1.7 | 5.2 | 3.1 | 2.7 | 13.4 |
| DECREASED RATE OF OUTGAS (%) |  | 44 | 35 | 50 | 20 | 25 | 61 |

As shown in Table 1, it is found that the decreased rate of outgas discharged from the external component 5 (Component 1 to Component 6) as compared the external component 5 (Component 1 to Component 6) after being annealed with the external component 5 (Component 1 to Component 6) before annealing is not less than 20% per the unit weight of the external component 5. Thereamong, in Component 6, the decreased rate of outgas is particularly great and it is found that the value reaches up to 61%. As a result, for an annealed external component, it is found that the discharge amount of outgas decreases, and thus it is possible to reduce the influence of outgas on a substrate stored in the container main body 2 closed by the lid body 3.

According to the substrate storing container 1 according to the embodiments of the abovementioned configurations, the following effects can be obtained.

A substrate storing container 1 which stores substrates composed of semiconductor wafers and is transported in a state of being stored in a container storing bag that is entirely sealed, the substrate storing container includes a container main body 2 including a main body inner face that forms a substrate storing space that can store a plurality of substrates, and an opening rim portion 28 at which a container main body opening portion 21 in communication with the substrate storing space is formed; a lid body 3 which includes a lid body main body 32 having a lid body inner face and a lid body outer face 31, is detachable to the opening rim portion 28, and can close the container main body opening portion 21, in which the lid body inner face forms the substrate storing space together with the main body inner face when the container main body opening portion 21 is closed; and an external component 5 made from resin that is mounted to at least one of a part of the container main body 2 other than the main body inner face, and a part of the lid body main body 32 other than the lid body inner face, in which the external component 5 is annealed.

The external component 5 does not support a substrate. Furthermore, the external component 5 has a shape and a size that suppress to some extent the dimensional deformation of the external component 5 occurring by internal stress from being caused at the external component 5. For this reason, a higher dimensional precision is not required normally for the external component 5, and there is no necessity of annealing the external component 5 so far as making the process of manufacturing the external component 5 complicated. However, on the contrary, the inventors of the present application came to realize that, by conducting the annealing process, it reduced the influence of outgas caused from the external component 5 mounted at the outside of the container main body 2, on the substrates stored in the substrate storing space of the substrate storing container 1 which is closed. With such a configuration, it is possible to not only improve the dimensional precision of the external component 5 but also establish the external component 5 with less amount of generated outgas.

When the substrate storing container 1 which is stored in a double container storing bag (a packaging bag), the whole of which is sealed, is transported by air, since the atmospheric pressure decreases at high altitude, it is estimated that the gas in the substrate storing container 1 discharges in the double container storing bag outside the substrate storing container 1 through a breather valve 39 (FIG. 1) provided at the lid body 3. Thereafter, it is estimated that, upon landing, the atmospheric pressure increases and the air in the double container storing bag outside the substrate storing container 1 returns in the substrate storing container 1 through the breather valve 39. It is estimated that, at this moment, the air in contact with the external component 5 returns to the substrate storing container 1 through the breather valve 39. However, as described above, since the external component 5 is annealed, it is possible to reduce the influence of outgas on substrates in the substrate storing container 1.

Furthermore, the external component 5 has a size such that, in a direction along the outer face to which the external component 5 is mounted or the lid body outer face 31 among an outer face of the back wall 22, an outer face of the upper wall 23, an outer face of the lower wall 24, outer faces of the side walls 25, 26, and the lid body outer face 31, the external component does not go beyond the outer face to which the external component 5 is mounted or the lid body outer face 31, and falls into an area of the outer face to which the external component 5 is mounted or the lid body outer face 31. Furthermore, the external component 5 includes one external component wall portion, and one other external component wall portion which has a positional relationship of intersecting with the one external component wall portion by a predetermined angle and is connected with the one external component wall portion.

With these configurations, it is possible to establish the shape of the external component 5 which can suppress dimensional deformation occurring in the external component 5 due to an internal stress of the external component 5. For this reason, it is possible to establish the external component 5 that can obtain a predetermined dimensional precision even without annealing. As a result, by annealing the external component 5, it is possible to not only greatly improve the dimensional precision of the external component 5, but also establish the external component 5 which can suppress the generation of outgas.

Furthermore, the container main body 2 is made from polycarbonate. Furthermore, the lid body main body 32 is made from polycarbonate. With these configurations, it is possible to establish a configuration in which dimensional deformation hardly occurs by internal stress in the container main body 2 and the lid body main body 32. For this reason, by fixing and mounting the external component 5 to the container main body 2 or the lid body main body 32, it is possible to obtain a predetermined dimensional precision even with the external component 5 which is not annealed. As a result, by annealing the external component 5, it is possible to not only greatly improve the dimensional precision of the external component 5, but also establish the external component 5 which can suppress the generation of outgas.

Furthermore, the external component 5 is made from any one selected from the group consisting of polybutylene terephthalate, polyacetal, and polypropylene. Furthermore, a value of a decreased rate of outgas per unit weight of the external component 5 obtained from an amount of outgas obtained by way of DHS method by cutting into predetermined dimensions of 3 mm to 4 mm and heating for one hour at 100° C. in a thermal desorption GC-MS instrument the external component 5 before annealing made from polybutylene terephthalate or polyacetal, and an amount of outgas obtained by way of DHS method by cutting into the predetermined dimensions of 3 mm to 4 mm and heating for one hour at 100° C. with a thermal desorption GC-MS instrument the external component 5 after annealing made from polybutylene terephthalate or polyacetal, is at least 20%. Furthermore, a value of a decreased rate of outgas per unit weight of the external component 5 obtained from an amount of outgas obtained by way of DHS method by cutting into predetermined dimensions of 3 mm to 4 mm and heating for one hour at 80° C. with a thermal desorption GC-MS instrument the external component 5 before annealing made from polypropylene, and an amount of outgas obtained by way of DHS method by cutting into the predetermined dimensions of 3 mm to 4 mm and heating for one hour at 80° C. with a thermal desorption GC-MS instrument the external component 5 after annealing made of polypropylene, is at least 20%. Therefore, by annealing the external component 5 which tends to generate outgas, it is possible to establish the external component with less amount of generated outgas (low outgas external component).

The present invention is not limited to the abovementioned embodiments, and modifications thereto within the technical scope claimed in the claims are possible. For example, the shape and the configuration of the substrate storing container 1 are not limited to the shapes and the configurations of the abovementioned embodiments. For example, the container main body 2 or the lid body main body 32 is not limited to being made from polycarbonate. The container main body 2 or the lid body main body 32 may be made from either cycloolefin polymer or liquid crystal polymer in place of polycarbonate. Then, it is acceptable so long as the external component configured from any of polybutylene terephthalate, polyacetal and polypropylene is mounted to the container main body or the lid body main body made from such materials.

EXPLANATION OF REFERENCE NUMERALS 1 substrate storing container
2 container main body
3 lid body
5 external component
21 container main body opening portion
22 back wall
24 lower wall
28 opening rim portion
31 lid body outer face
32 lid body main body
221, 241 outer face
511A one wall portion (one external component wall portion)
511B the other wall portion (other external component wall portion)
521 rear wall (one external component wall portion)
522 bottom portion identification portion (other external component wall portion)
525A planar portion (one external component wall portion)
525B edge portion wall portion (other external component wall portion)
531 side wall (other external component wall portion)
531A wall portion (one external component wall portion)
551 rotation member flat portion (one external component wall portion)
552 rotation member rim wall (the other external component wall portion)
561 elongated portion (one external component wall portion)
562 side plate portion (other external component wall portion)
571 side plate portion (one external component wall portion)
572 one end side connection plate (other external component wall portion)
573 other end side connection plate (other external component wall portion)

The invention claimed is:

1. A substrate storing container which stores substrates composed of semiconductor wafers and is transported in a state of being stored in a container storing bag that is entirely sealed, the substrate storing container comprising:
a container main body including a main body inner face that forms a substrate storing space that can store a plurality of substrates, and an opening rim portion at which a container main body opening portion in communication with the substrate storing space is formed;
a lid body which includes a lid body main body having a lid body inner face and a lid body outer face, is detachable to the opening rim portion, and can close the container main body opening portion, wherein the lid body inner face forms the substrate storing space together with the main body inner face when the container main body opening portion is closed;
an at least one external component made from resin that is mounted to at least one of a part of the container main body other than the main body inner face, or a part of the lid body main body other than the lid body inner face, wherein the at least one external component comprises a latch cassette annealed on the lid body outer face of the lid body, and
a breather valve which, when atmospheric pressure outside the substrate storing container increases or decreases relative to atmospheric pressure inside the substrate storing container, allows air inside the substrate storing container to discharge outside the substrate storing container or return inside the substrate storing container,
wherein, when atmospheric pressure outside the container storing bag which is sealed decreases, air in the substrate storing space exits to a space inside the container storing bag outside the substrate storing container through the breather valve, and when atmospheric pressure outside the container storing bag which is sealed increases by being in contact with the external component, the air in contact with the external component returns to the substrate storing space through the breather valve, wherein the at least one external component is annealed.

2. The substrate storing container according to claim 1,
wherein the container main body includes a tubular wall portion in which the container main body opening portion is formed at one end and in which the other end is closed, the wall portion including a back wall, an upper wall, a lower wall, and a pair of side walls, wherein the container main body opening portion is formed by one end of the upper wall, one end of the lower wall, and one end of the side walls, wherein an inner face of the upper wall, an inner face of the lower wall, an inner face of the side walls, and an inner face of the back wall constitute a main body inner face, and wherein each of the at least one external component has a size such that, in a direction along the outer face to which the each of the at least one external component is mounted or the lid body outer face among an outer face of the back wall, an outer face of the upper wall, an outer face of the lower wall, outer faces of the side walls, and the lid body outer face, the each of the at least one external component does not go beyond the outer face to which the each of the at least one external component is mounted or the lid body outer face, and falls into an area of the outer face to which the each of the at least one external component is mounted on the lid body outer face.

3. The substrate storing container according to claim 1,
wherein the at least one external component includes one external component wall portion, and one other external component wall portion which has a positional relationship of intersecting with the one external component wall portion by a predetermined angle and is connected with the one external component wall portion.

4. The substrate storing container according to claim 1,
wherein the at least one external component is made from any one selected from the group consisting of polybutylene terephthalate, polyacetal, and polypropylene.

5. The substrate storing container according to claim 1,
wherein a value of a decreased rate of outgas per unit weight of the at least one external component obtained from an amount of outgas obtained by way of DHS method by cutting into predetermined dimensions and heating for one hour at 100° C. in a thermal desorption GC-MS instrument the at least one external component before annealing made from polybutylene terephthalate or polyacetal, and an amount of outgas obtained by way of DHS method by cutting into the predetermined dimensions and heating for one hour at 100° C. with a thermal desorption GC-MS instrument the at least one external component after annealing made from polybutylene terephthalate or polyacetal, is at least 20%.

6. The substrate storing container according to claim 1,
wherein a value of a decreased rate of outgas per unit weight of the at least one external component obtained from an amount of outgas obtained by way of DHS method by cutting into predetermined dimensions and heating for one hour at 80° C. with a thermal desorption GC-MS instrument the at least one external component before annealing made from polypropylene, and an amount of outgas obtained by way of DHS method by cutting into the predetermined dimensions and heating for one hour at 80° C. with a thermal desorption GC-MS instrument the at least one external component after annealing made of polypropylene, is at least 20%.

* * * * *